United States Patent
Tian et al.

(10) Patent No.: US 11,191,160 B2
(45) Date of Patent: Nov. 30, 2021

(54) FLEXIBLE BASE SUBSTRATE, MANUFACTURING METHOD THEREOF, DISPLAY DEVICE

(71) Applicant: BOE TECHNOLOGY GROUP CO., LTD., Beijing (CN)

(72) Inventors: Hongwei Tian, Beijing (CN); Yanan Niu, Beijing (CN); Zheng Liu, Beijing (CN); Meng Zhao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 80 days.

(21) Appl. No.: 16/607,332

(22) PCT Filed: Apr. 2, 2019

(86) PCT No.: PCT/CN2019/080930
§ 371 (c)(1),
(2) Date: Oct. 22, 2019

(87) PCT Pub. No.: WO2019/192450
PCT Pub. Date: Oct. 10, 2019

(65) Prior Publication Data
US 2020/0396837 A1    Dec. 17, 2020

(30) Foreign Application Priority Data
Apr. 3, 2018 (CN) .......................... 201810292316.0

(51) Int. Cl.
*H05K 1/00* (2006.01)
*H05K 1/11* (2006.01)
(Continued)

(52) U.S. Cl.
CPC ....... *H05K 1/118* (2013.01); *G02F 1/133305* (2013.01); *H01L 27/3244* (2013.01); *H01L 51/0097* (2013.01)

(58) Field of Classification Search
CPC .............. H05K 1/118; G02F 1/133305; H01L 27/3244; H01L 51/0097
(Continued)

(56) References Cited

U.S. PATENT DOCUMENTS

| | | | |
|---|---|---|---|
| 2003/0160538 A1* | 8/2003 | Tomonari | F15C 5/00 310/307 |
| 2015/0173176 A1 | 6/2015 | Lee | |

(Continued)

FOREIGN PATENT DOCUMENTS

| | | |
|---|---|---|
| CN | 104392901 A | 3/2015 |
| CN | 105702624 A | 6/2016 |

(Continued)

OTHER PUBLICATIONS

International Search Report received for PCT Patent Application No. PCT/CN2019/080930, dated Jul. 3, 2019, 5 pages (2 pages of English Translation and 3 pages of Original Document).

*Primary Examiner* — Andargie M Aychillhum
(74) *Attorney, Agent, or Firm* — Womble Bond Dickinson (US) LLP

(57) ABSTRACT

A flexible base substrate, a manufacturing method thereof, and a display device are provided. The flexible base substrate includes a first flexible substrate. The first flexible substrate includes: a first flexible film layer including a flexible film layer body, and a plurality of protrusions spaced apart from each other on a surface of a side of the flexible film layer body; a first spacer layer on the first flexible film layer and including a plurality of first islands spaced apart from each other; and a first groove between adjacent first islands. The first groove is filled with a first organic material, and a height of the first organic material is smaller than a height of the first groove in a direction perpendicular to the flexible film layer body.

18 Claims, 9 Drawing Sheets

(51) Int. Cl.
  *G02F 1/1333* (2006.01)
  *H01L 27/32* (2006.01)
  *H01L 51/00* (2006.01)

(58) Field of Classification Search
  USPC .......................................................... 174/254
  See application file for complete search history.

(56) References Cited

U.S. PATENT DOCUMENTS

2016/0322403 A1* 11/2016 Gao ........................ B32B 37/14
2018/0104915 A1    4/2018 Liu

FOREIGN PATENT DOCUMENTS

CN     108305892 A    7/2018
CN     207925472 U    9/2018

* cited by examiner

FLEXIBLE BASE SUBSTRATE, MANUFACTURING METHOD THEREOF, DISPLAY DEVICE

RELATED APPLICATION

The present application is the U.S. national phase entry of PCT/CN2019/080,930, with an international filing date of Apr. 2, 2019, which claims the benefit of Chinese Patent Application No. 201810292316.0, filed on Apr. 3, 2018, the entire disclosure of which is incorporated herein by reference.

FIELD

The present disclosure relates to the field of display technologies, and especially to a flexible base substrate, a manufacturing method thereof, and a display device.

BACKGROUND

With the development of flexible processes, flexible devices' elasticity and flexibility have progressively transitioned from being bendable and foldable to being stretchable so as to meet a user requirement for more forms of deformation of a flexible device.

SUMMARY

An aspect of the present disclosure provides a flexible base substrate comprising a first flexible substrate, the first flexible substrate comprising: a first flexible film layer, the first flexible film layer comprising a flexible film layer body, and a plurality of protrusions spaced apart from each other on a surface of a side of the flexible film layer body; a first spacer layer, the first spacer layer being disposed on the first flexible film layer and comprising a plurality of first islands spaced apart from each other; and a first groove between adjacent first islands, the first groove being filled with a first organic material, and a height of the first organic material being smaller than a height of the first groove in a direction perpendicular to the flexible film layer body. Each protrusion is positionally corresponding to one of the first islands in the direction perpendicular to the flexible film layer body, and orthographic projections of a gap between adjacent ones of the protrusions and a gap between adjacent ones of the first islands on the flexible film layer body have a first overlapping region.

According to some exemplary embodiments of the present disclosure, the first spacer layer is disposed on a side of the flexible film layer body away from the plurality of protrusions.

According to some exemplary embodiments of the present disclosure, each of the plurality of protrusions is disposed between the flexible film layer body and a positionally corresponding first island.

According to some exemplary embodiments of the present disclosure, each protrusion has a thickness of 40% to 120% of a thickness of the flexible film layer body.

According to some exemplary embodiments of the present disclosure, each protrusion has a thickness of 30% to 60% of a thickness of the flexible film layer body.

According to some exemplary embodiments of the present disclosure, an orthographic projection of each of the plurality of protrusions on the flexible film layer body completely overlaps an orthographic projection of a positionally corresponding first island on the flexible film layer body.

According to some exemplary embodiments of the present disclosure, the first organic material is the same as a material of the first flexible film layer.

According to some exemplary embodiments of the present disclosure, the above flexible base substrate further comprises a second flexible substrate, the second flexible substrate comprising: a second flexible film layer; and a second spacer layer, the second spacer layer being disposed on a side of the second flexible film layer away from the first flexible film layer, and comprising a plurality of second islands spaced apart from each other, each of the second islands being positionally corresponding to one of the protrusions in the direction perpendicular to the flexible film layer body, and an orthographic projection of a gap between adjacent ones of the second islands on the flexible film layer body and the first overlapping region having a second overlapping region. A portion of the second flexible film layer fills the first groove.

According to some exemplary embodiments of the present disclosure, the above flexible base substrate further comprises a second flexible substrate, the second flexible substrate comprising: a second flexible film layer; and a second spacer layer, the second spacer layer being disposed on a side of the second flexible film layer away from the first flexible film layer, and comprising a plurality of second islands spaced apart from each other, each of the second islands being positionally corresponding to one of the protrusions in the direction perpendicular to the flexible film layer body, and an orthographic projection of a gap between adjacent ones of the second islands on the flexible film layer body and the first overlapping region having a second overlapping region. A portion of the second flexible film layer fills the first groove, and the portion of the second flexible film layer serves as the first organic material.

According to some exemplary embodiments of the present disclosure, the above flexible base substrate further comprises a second organic material between adjacent ones of the second islands.

According to some exemplary embodiments of the present disclosure, the above flexible base substrate further comprises a second organic material between adjacent ones of the second islands, wherein a height of a surface of the second organic material away from the flexible film layer body is smaller than a height of a surface of the second island away from the flexible film layer body.

According to some exemplary embodiments of the present disclosure, orthographic projections of a first island, a second island and a protrusion positionally corresponding to each other on the flexible film layer body completely overlap each other.

According to some exemplary embodiments of the present disclosure, the first spacer layer further comprises a first protection pattern between adjacent ones of the first islands, and the first protection pattern has a thickness smaller than that of the first island.

According to some exemplary embodiments of the present disclosure, the second spacer layer further comprises a second protection pattern between adjacent ones of the second islands, and the second protection pattern has a thickness smaller than that of a second island.

According to some exemplary embodiments of the present disclosure, the first flexible film layer has a thickness larger than that of the second flexible film layer.

Another aspect of the present disclosure provides a display device comprising any of the flexible base substrates described above.

A further aspect of the present disclosure provides a manufacturing method of a flexible base substrate, comprising: providing a first flexible film layer, the first flexible film layer comprising a flexible film layer body, and a plurality of protrusions spaced apart from each other on a surface of a side of the flexible film layer body; forming a first spacer layer on the first flexible film layer, the first spacer layer comprising a plurality of first islands spaced apart from each other; and forming a first groove between adjacent ones of the first islands, the first groove being filled with a first organic material, and a height of the first organic material being smaller than a height of the first groove in a direction perpendicular to the flexible film layer body. Each of the protrusions is positionally corresponding to one of the first islands in the direction perpendicular to the flexible film layer body, and orthographic projections of a gap between adjacent ones of the protrusions and a gap between adjacent ones of the first islands on the flexible film layer body have a first overlapping region.

According to some exemplary embodiments of the present disclosure, said providing a first flexible film layer comprises: disposing a plurality of blind holes spaced apart from each other in a rigid substrate; forming a first flexible film layer on a side of the rigid substrate provided with the blind holes, portions of the first flexible film layer in the blind holes forming the protrusions, portions of the first flexible film layer other than the portions forming the protrusions forming the flexible film layer body.

According to some exemplary embodiments of the present disclosure, said providing a first flexible film layer comprises: forming a flexible film on a rigid substrate; forming a first photoresist pattern on the flexible film using a mask exposure process; and etching the flexible film using the first photoresist pattern as a mask to form the first flexible film layer, the protrusions being located on a side of the flexible film layer body away from the rigid substrate.

According to some exemplary embodiments of the present disclosure, the above manufacturing method further comprises: providing a second flexible film layer; and providing a second spacer layer on a side of the second flexible film layer away from the first flexible film layer, the second spacer layer comprising a plurality of second islands spaced apart from each other, each of the second islands being positionally corresponding to one of the protrusions in the direction perpendicular to the flexible film layer body, and an orthographic projection of a gap between adjacent ones of the second islands on the flexible film layer body and the first overlapping region having a second overlapping region. A portion of the second flexible film layer fills the first groove.

BRIEF DESCRIPTION OF THE DRAWINGS

In order to more clearly illustrate embodiments of the present disclosure or technical solutions in the prior art, the drawings to be used for description of the embodiments or the prior art will be briefly described below. Obviously, the drawings in the description below only illustrate some embodiments of the present disclosure. Other drawings may also be obtained by a person having an ordinary skill in the art based on these drawings without spending inventive efforts.

DETAILED DESCRIPTION

The technical solutions in embodiments of the present disclosure will be clearly and completely described below with reference to the accompanying drawings in the embodiments of the present disclosure. It is obvious that the described embodiments are only a part of the embodiments of the present disclosure, rather than all of them. All other embodiments obtained by a person having an ordinary skill in the art based on the embodiments of the present disclosure without spending inventive efforts fall within the scope of the present disclosure.

Figure 1:
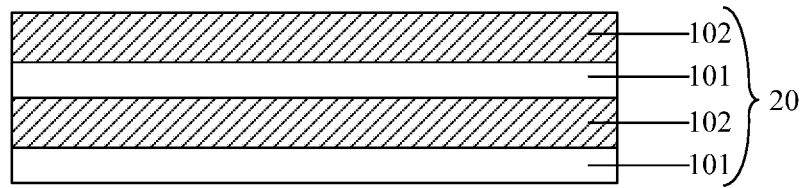
FIG. 1 is a schematic structural view of a conventional flexible base substrate.

FIG. 1 illustrates a conventional flexible base substrate 20 comprising two flexible substrates laminated on each other, each flexible substrate comprising a flexible film layer 101 and a spacer layer 102 on the flexible film layer.

In the flexible base substrate 20 shown in FIG. 1, since each flexible substrate comprises a thick inorganic film layer (i.e., spacer layer 102), when bending or stretching with a small radius is performed, the probability of breakage and cracking of the inorganic film layer will be greatly increased. In particular, when the flexible base substrate is subjected to elastic stretching, the inorganic film layer will undergo processes such as collision, separation, and the like due to severe local deformations, which is likely to cause minute breakage. The minute breakage may gradually develop into larger cracks that will expand along the flexible base substrate and finally result in damage to the flexible base substrate. As a result, in case such a flexible base substrate is applied to a display device, the reliability of the display device is deteriorated.

Figure 2A:
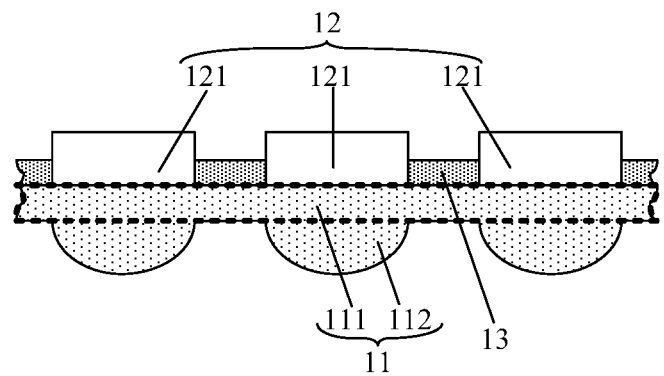
FIG. 2(a) is a schematic structural view of a flexible base substrate provided by an embodiment of the present disclosure.
Figure 2B:
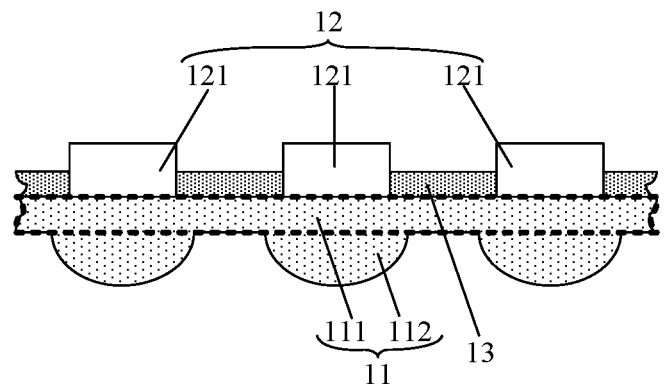
FIG. 2(b) is a schematic structural view of a flexible base substrate provided by an embodiment of the present disclosure.
Figure 2C:
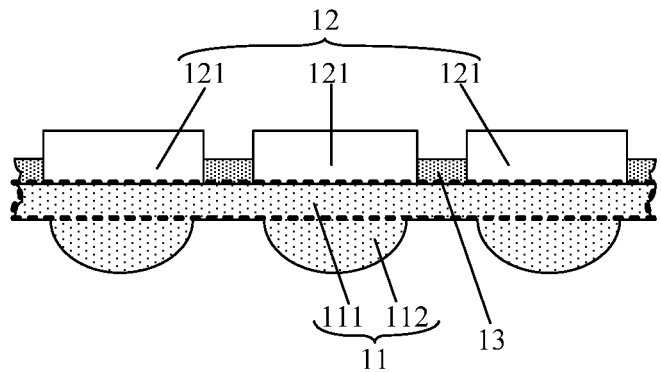
FIG. 2(c) is a schematic structural view of a flexible base substrate provided by an embodiment of the present disclosure.

In view of this, an embodiment of the present disclosure provides a flexible base substrate, as shown in FIGS. 2(a), 2(b) and 2(c), comprising a first flexible substrate. The first flexible substrate comprises a first flexible film layer 11 and a first spacer layer 12 on a side of the first flexible film layer 11. The first flexible film layer 11 comprises a flexible film layer body 111 and a plurality of protrusions 112 spaced apart from each other on a surface of a side of the flexible film layer body 111 away from the first spacer layer 12. The first spacer layer 12 comprises a plurality of first islands 121 spaced apart from each other. Each of the protrusions 112 corresponds to a first island 121 in a direction perpendicular to the surface of the flexible base substrate, and orthographic projections of a gap between adjacent protrusions 112 and a gap between adjacent first islands 121 on the flexible film layer body 111 have a first overlapping region.

Further, as shown in FIGS. 2(a), 2(b) and 2(c), the gap between adjacent first islands 121 is filled with an organic material 13, and a height of the organic material 13 in the direction perpendicular to the flexible base substrate is smaller than a height of a first island 121 in this direction.

Here, an inorganic material may be employed as the material of the first spacer layer 12, for example, the material of the first spacer layer 12 may be SiOx.

It is to be noted that, in the above embodiment, a shape of a protrusion 112 is not limited, and a surface of a side thereof away from the flexible film layer body 111 may be a curved surface or a flat surface. When the surface of the side of the protrusion 112 away from the flexible film layer body 111 is a flat surface, the shape of the flat surface may be a circle, a rectangle, a diamond, a polygon, or the like.

Further, a thickness of the protrusion 112 is not limited either as long as a gap can be formed between adjacent protrusions 112. For example, the thickness of the protrusions 112 may be 20% to 200% of the thickness of the flexible film layer body 111. In order to reduce the manufacturing cost, in particular, the thickness of a protrusion 112 may be 40% to 120% of the thickness of the flexible film layer body 111. As used herein, the "thickness" of a layer refers to the dimension of the layer in a direction perpendicular to the flexible base substrate and/or the flexible film layer body, i.e., the height of the layer in the direction perpendicular to the flexible base substrate and/or the flexible film layer body.

In the above embodiment, since the gap between adjacent protrusions 112 can be regarded as a groove with respect to the protrusions 112, when the flexible base substrate is being bent or elastically deformed in the direction perpendicular to the flexible base substrate, the groove between adjacent protrusions 112 can disperse the pressure applied to the surface of a side of the first flexible film layer 11 away from the first spacer layer 12, thereby reducing damage resulting from bending or elastic deformation of the flexible base substrate. On this basis, an organic material 13 is filled in the gap between adjacent first islands 121. Therefore, compared to the scheme of filling an inorganic material in the gap between adjacent first islands 121, when this flexible base substrate is being bent, stretched or elastically deformed, only the organic material 13 filled in the gap between adjacent first islands 121 is deformed, so that damage to the inorganic material can be avoided, and crack growth can also be prevented even if part of the inorganic material in the first island 121 is damaged.

On this basis, in case the flexible base substrate is applied to a display device, since the capabilities of stretching, bending, elasticity and flexibility of the flexible base substrate are enhanced, the flexible film layer may have an increased tolerance when a display pattern thereon is being deformed, thereby improving the reliability and yield of the display device.

Figure 3A:
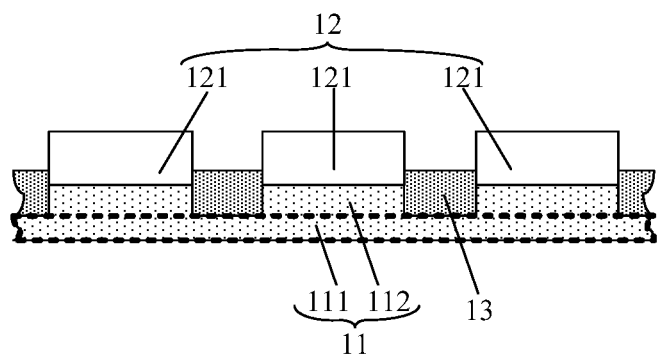
FIG. 3(a) is a schematic structural view of a flexible base substrate provided by an embodiment of the present disclosure.
Figure 3B:
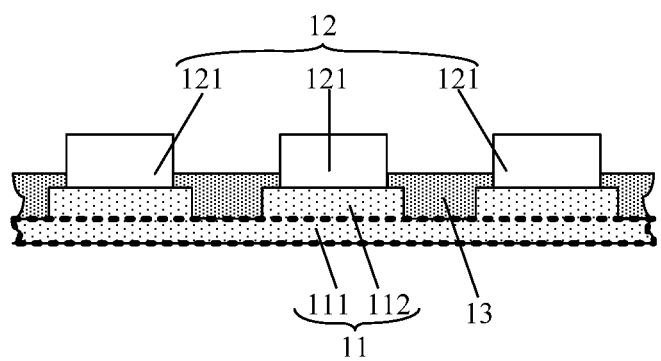
FIG. 3(b) is a schematic structural view of a flexible base substrate provided by an embodiment of the present disclosure.
Figure 3C:
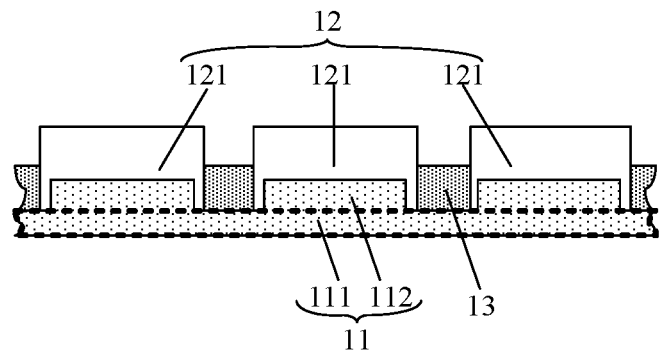
FIG. 3(c) is a schematic structural view of a flexible base substrate provided by an embodiment of the present disclosure.

FIGS. 3(a), 3(b) and 3(c) illustrate a flexible base substrate according to a further embodiment of the present disclosure. The flexible base substrate as shown in FIGS. 3(a), 3(b) and 3(c) has the same structures and/or configurations as those shown in FIGS. 2(a), 2(b) and 2(c), except for the relative positions of the first islands 121 and the protrusions 112. Thus, elements having substantially the same functions as those in the embodiment shown in FIGS. 2(a), 2(b) and 2(c) will have the same reference numerals and will not be described and/or illustrated in detail here for the sake of brevity.

As shown in FIGS. 3(a), 3(b) and 3(c), instead of placing the first islands 121 and the protrusions 112 on opposite sides of the flexible film layer body 111, the first islands 121 and the protrusions 112 are disposed on the same side of the flexible film layer body 111, and the protrusions 112 are between the first islands 121 and the flexible film layer body 111. A first groove between adjacent laminations including a protrusion 112 and its corresponding first island 121 is filled with an organic material 13, and a height of the organic material 13 in a direction perpendicular to the flexible base substrate is smaller than a height of the first groove. In the case where the flexible base substrate further comprises a flexible substrate other than the first flexible substrate, the height of the portions of the flexible base substrate filled with the organic material 13 will still be lower than the height of the portions of the flexible base substrate other than those filled with the organic material 13.

In such an embodiment, in consideration of the need for further disposing the first spacer layer 12 on a side of the protrusions 112 away from the flexible film layer body 111, the surface of the side of the protrusion 112 away from the flexible film layer body 111 is a flat surface, and the shape of the flat surface may be a circle, a rectangle, a diamond, a polygon, or the like.

Further, the thickness of the protrusions 112 may be 20% to 80% of the thickness of the flexible film layer body 111.

For example, in order to reduce the manufacturing cost, the thickness of the protrusions 112 may be 30% to 60% of the thickness of the flexible film layer body 111. In the embodiment as shown in FIGS. 3(a), 3(b) and 3(c), since the height of the organic material 13 is smaller than the height of the first groove, the first groove filled with the organic material 13 is still a groove. In this way, when the flexible base substrate is being bent or elastically deformed in the direction perpendicular to the flexible base substrate, a groove formed after the first groove is filled with the organic material 13 can disperse the pressure applied to the surface of a side of the flexible film layer 11 close to the first spacer layer 12, thereby reducing damage resulting from bending or elastic deformation of the flexible base substrate. On this basis, the first groove is filled with the organic material 13. Therefore, compared to the scheme of filling an inorganic material in the gap between adjacent first islands 121, when this flexible base substrate is being bent, stretched or elastically deformed, only the organic material 13 filled in the first groove is deformed, so that damage to the inorganic material can be avoided, and crack growth can also be prevented even if part of the inorganic material in the first island 121 is damaged.

On this basis, in case the flexible base substrate is applied to a display device, since the capabilities of stretching, bending, elasticity and flexibility of the flexible base substrate are enhanced, the flexible film layer may have an increased tolerance when a display pattern thereon is deformed, thereby improving the reliability and yield of the display device.

In the embodiments shown in FIGS. 2(a), 2(b), 2(c), 3(a), 3(b) and 3(c), the dimensional relationship between any protrusion 112 and a positionally corresponding first island 121 thereof is not limited in a direction parallel to the flexible base substrate, as long as each protrusion 112 is positionally corresponding to a first island 121, and the orthographic projections of a gap between adjacent protrusions 112 and a gap between adjacent first islands 121 on the flexible film layer body 111 have a first overlapping region. For example, as shown in FIGS. 2(a) and 3(a), the orthographic projections of a first island 121 and a positionally corresponding protrusion 112 thereof on the flexible film layer body 111 completely overlap each other. Alternatively, as shown in FIGS. 2(b) and 3(b), the area of the orthographic projection of the first island 121 on the flexible film layer body 111 is smaller than the area of the orthographic projection of the protrusion 112 on the flexible film layer body 111, and the orthographic projection of the protrusion 112 on the flexible film layer body 111 completely covers the orthographic projection of the first island 121 on the flexible film layer body 111. Alternatively, as shown in FIGS. 2(c) and 3(c), the area of the orthographic projection of the first island 121 on the flexible film layer body 111 is larger than the area of the orthographic projection of the protrusion 112 on the flexible film layer body 111, and the orthographic projection of the first island 121 on the flexible film layer body 111 completely covers the orthographic projection of the protrusion 112 on the flexible film layer body 111.

In an exemplary embodiment, the organic material 13 filled in the first groove or the gap between adjacent first islands 121 may be the same as or different from the material of the first flexible film layer 11, as long as the organic material 13 filled in the first groove or the gap between adjacent first islands 121 and the material of the first flexible film layer 11 both have high flexibility. For example, the organic material 13 and the material of the first organic film layer 11 may be polyimide (PI).

The flexible base substrate described above may comprise only the first flexible substrate, or may further comprise another flexible substrate other than the first flexible substrate. The another flexible substrate may have one layer or multiple layers. For example, the another flexible substrate may be a flexible substrate comprising a flexible film layer and a spacer layer laminated on each other as shown in FIG. 1.

If no other pattern is disposed on the flexible base substrate, the number of layers of the flexible film layer in the flexible base substrate is determined by a position of a neutral layer of the flexible base substrate. If other patterns are further disposed on the flexible base substrate, the flexible base substrate and the patterns disposed on the flexible base substrate together form a flexible substrate, and the number of layers of the flexible film layer in the flexible base substrate is determined by a position of a neutral layer of the formed flexible substrate.

Figure 4:
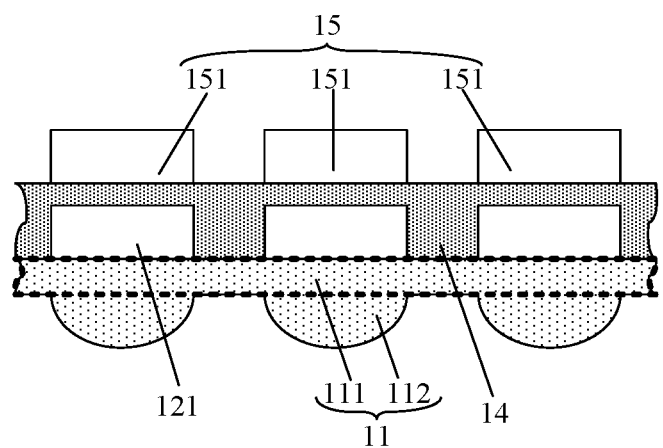
FIG. 4 is a schematic structural view of a flexible base substrate provided by an embodiment of the present disclosure.

In a further embodiment, as shown in FIG. 4, further, the flexible base substrate further comprises a second flexible substrate, a second flexible film layer 14 and a second spacer layer 15 of the second flexible substrate are disposed successively on a side of the first spacer layer 12 away from the first flexible film layer 11, and the second flexible film layer 14 falls into the gap between adjacent first islands 121. The second spacer layer 15 comprises a plurality of second islands 151 spaced apart from each other, each of the second islands 151 is positionally corresponding to a protrusion 112 in the direction perpendicular to the flexible base substrate, and an orthographic projection of a gap between adjacent second islands 151 on the flexible film layer body 111 and the first overlapping region have a second overlapping region.

In the embodiment shown in FIG. 4, the dimensional relationship between any protrusion 112 and a positionally corresponding second island 151 thereof is not limited in the direction parallel to the flexible base substrate, as long as each protrusion 112 is positionally corresponding to a second island 151, and the orthographic projection of the gap between adjacent second islands 151 on the flexible film layer body 111 and the first overlapping region have a second overlapping region. If the flexible substrate is applied to a display device, orthographic projections of a first island 121, a second island 151, and a protrusion 112 on the flexible film layer body 111 may overlap orthographic projection of one or even thousands of sub-pixels on the flexible film layer body 111.

Specifically, in an exemplary embodiment, as shown in FIGS. 3 and 4, the orthographic projections of the first island 121 and the second island 151 on the flexible film layer body 111 completely overlap the orthographic projection of a protrusion 112 on the flexible film layer body 111. Alternatively, the orthographic projection of the first island 121 on the flexible film layer body 111 is smaller or larger than the orthographic projection of the protrusion 112 on the flexible film layer body 111, and the orthographic projection of the second island 151 on the flexible film layer body 111 may only overlap the orthographic projection of the protrusion 112 on the flexible film layer body 111, or may only overlap the orthographic projection of the first island 121 on the flexible film layer body 111. Of course, alternatively, the orthographic projection of the second island 151 on the flexible film layer body 111 may neither overlap the orthographic projection of the protrusion 112 on the flexible film layer body 111 nor overlap the orthographic projection of the first island 121 on the flexible film layer body 111.

When the orthographic projections of the first island 121 and the second island 151 on the flexible film layer body 111 completely overlap the orthographic projection of the protrusion 112 on the flexible film layer body 111, on the one hand, a space between adjacent first islands 121 is large enough so that more of the second flexible film layer 14 falls into the gap between adjacent first islands 121 to avoid damage to the inorganic material; on the other hand, the flexible base substrate can be bent, stretched, and elastically deformed only in the region where the gap between adjacent first islands 121 (which may also be adjacent second islands 151) is located as much as possible.

On this basis, in case the flexible base substrate is applied to a display device, it is possible to make the orthographic projection of a highly flexible metal wire on the flexible film layer body 111 fall into the orthographic projection of the gap between adjacent protrusions 112 on the flexible film layer body 111, so that the orthographic projections of display patterns that are not easily deformed such as an active layer, a gate insulating layer, and the like on the flexible film layer body 111 fall into the orthographic projections of the plurality of protrusions 112 on the flexible film layer body 111. The material of the above-mentioned highly flexible metal wire may be, for example, titanium (Ti), aluminum (Al) or the like.

As used above, the second flexible film layer 14 falling into the gap between adjacent first islands 121 means that a portion of the second flexible film layer 14 between adjacent first islands 121 is filled in the gap between the first islands 121 as the organic material 13. Therefore, the material of the second flexible film layer 14 may be the same as the material of the first organic film layer 11, for example, the material of the second flexible film layer 14 and the first organic film layer 11 is PI.

Since the height of the first groove is greater than the height of the gap between adjacent first islands 121 in the direction perpendicular to the flexible film layer body 111, when the second flexible film layer 14 has a large thickness, as shown in FIG. 4, the sum of the thickness of the first island 121 and the thickness of the portion of the second flexible film layer 14 on the first island 121 is substantially equal to the thickness of the portion of the second flexible film layer 14 between adjacent first islands 121.

Further, in order to bend or elastically deform the flexible base substrate along the direction perpendicular to the flexible base substrate, the thickness of the portion of the second flexible film layer 14 between adjacent first islands 121 may be reduced by exposure, development and etching processes during the process of forming the second flexible film layer 14, so that the thickness of the portion of the second flexible film layer 14 between adjacent first islands 121 is 20% to 80%, in particular, 40% to 60% of the thickness of other portions of the second flexible film layer 14.

Figure 5:
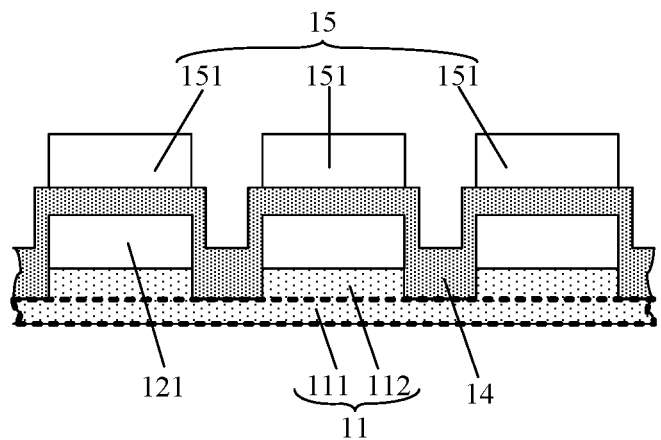
FIG. 5 is a schematic structural view of a flexible base substrate provided by an embodiment of the present disclosure.

FIG. 5 illustrates a schematic view of a flexible base substrate according to another embodiment of the present disclosure. The flexible base substrate as shown in FIG. 5 has the same structures and/or configurations as those shown in FIG. 4 except for the relative positions of the first islands 121 and the protrusions 112. Thus, elements having substantially the same functions as those in the embodiment shown in FIG. 4 will have the same reference numerals and will not be described and/or illustrated in detail here for the sake of brevity.

As shown in FIG. 5, the protrusion 112 is disposed between the flexible film layer body 111 and the first island 121, and the second flexible film layer 14 falls into the first groove. The thickness of the portion of the second flexible film layer 14 in the first groove is smaller than the height of the first groove in the direction perpendicular to the flexible film layer body 111.

As used herein, the second flexible film layer 14 falling into the first groove means that a portion of the second flexible film layer 14 in the first groove is filled in the first groove as the organic material 13.

Since the height of the first groove is greater than the height of the gap between adjacent first islands 121 in the direction perpendicular to the flexible film layer body 111, when the thickness of the second flexible film layer 14 is large, as shown in FIG. 5, the sum of the thickness of the first island 121 and the thickness of the portion of the second flexible film layer 14 on the first island 121 is larger than the thickness of the portion of the second flexible film layer 14 between adjacent first islands 121.

In the above embodiment of the present disclosure, the flexible base substrate may further comprise a second flexible substrate depending on the position of the neutral layer of the flexible base substrate, so as to improve the practicability of the flexible base substrate.

On this basis, the flexible base substrate may also comprise a third flexible substrate, a fourth flexible substrate, or even more flexible substrates depending on the position of the neutral layer. The structures and associated explanations of the third flexible substrate, the fourth flexible substrate, and even more flexible substrates are the same as the second flexible substrate.

Figure 6:
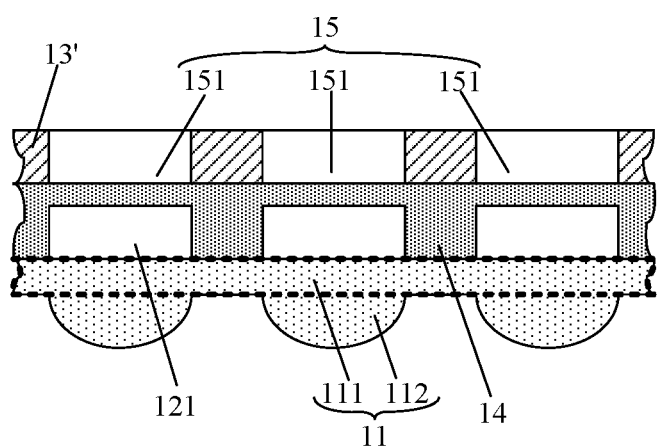
FIG. 6 is a schematic structural view of a flexible base substrate provided by an embodiment of the present disclosure.
Figure 7:
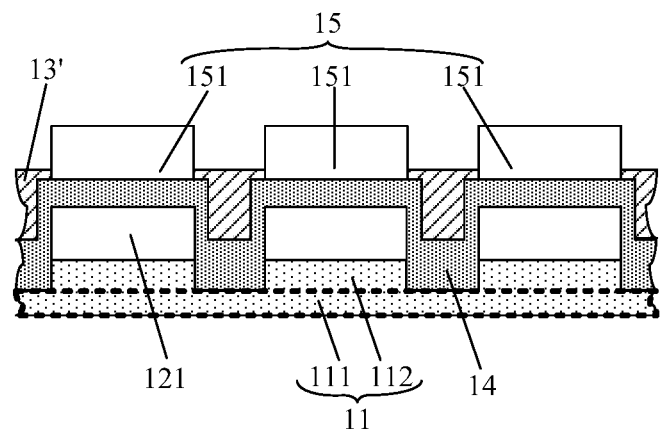
FIG. 7 is a schematic structural view of a flexible base substrate provided by an embodiment of the present disclosure.

Further, in the flexible base substrates as shown in FIGS. 4 and 5, as shown in FIGS. 6 and 7, an organic material 13' may be filled in the gap between adjacent second islands 151, or in a second groove between adjacent laminations including a protrusion 112, a first island 121 and a second island 151, and the height of all the organic materials 13' in the second grooves is smaller than the height of the second grooves.

Upon implementation, the organic material 13' may be filled in the second groove or in the gap between adjacent second islands 151 by a single process. Alternatively, in case the flexible base substrate is applied to a display device, the organic material 13' may be filled in the second groove or in the gap between adjacent second islands 151 during the process of forming display patterns on the flexible base substrate.

For example, in case the above flexible base substrate is applied to a display device, for example, when an interlayer insulating layer is being formed, an inorganic material is usually filled by digging a hole. If a hole filled with the inorganic material to form an interlayer insulating layer overlaps the second groove or the gap between adjacent second islands 151, the organic material 13' may be filed in the second groove or in the gap between adjacent second islands 151 prior to filling the inorganic material to form an interlayer insulating layer.

In the embodiment of the present disclosure, by filling the organic material 13' in the second groove or in the gap between adjacent second islands 151, the flexible base substrate can be further prevented from damage caused by bending, stretching and elastic deformation.

Figure 8A:
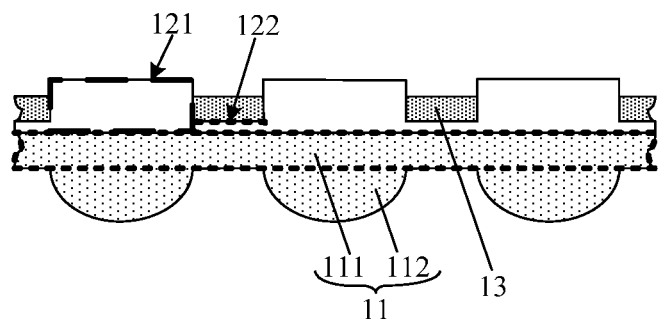
FIG. 8(a) is a schematic structural view of a flexible base substrate provided by an embodiment of the present disclosure.
Figure 8B:
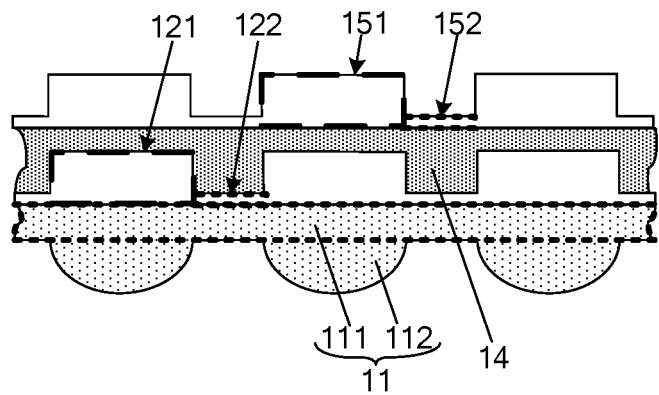
FIG. 8(b) is a schematic structural view of a flexible base substrate provided by an embodiment of the present disclosure.
Figure 9A:
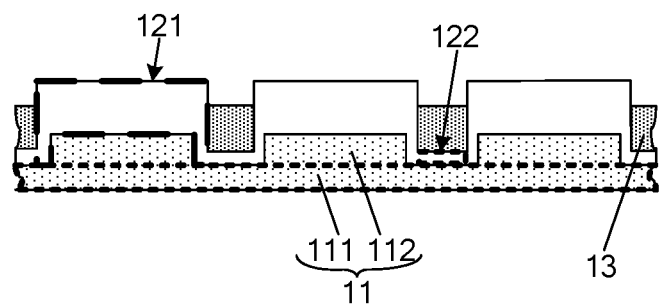
FIG. 9(a) is a schematic structural view of a flexible base substrate provided by an embodiment of the present disclosure.
Figure 9B:
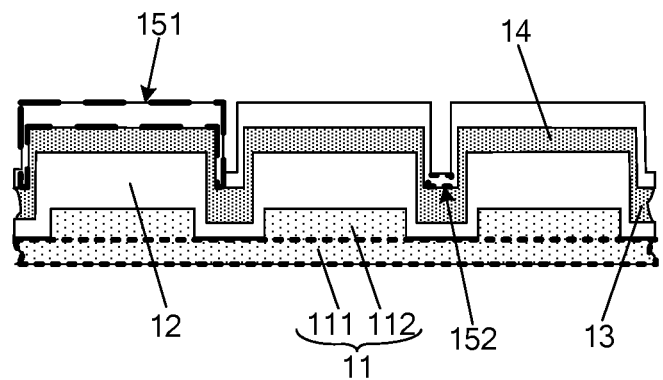
FIG. 9(b) is a schematic structural view of a flexible base substrate provided by an embodiment of the present disclosure.

In the embodiments shown in FIGS. 2(a)-2(c), 3(a)-3(c) and 4-7, as illustratively shown in FIGS. 8(a), 8(b) and 9(a), the first spacer layer 12 may further comprise a first protection pattern 122 between adjacent first islands 121. The second spacer layer 15 further comprises a second protection pattern 152 between adjacent second islands 151. The thickness of the first protection pattern 122 is smaller than the thickness of the first island 121, and the thickness of the second protection pattern 152 is smaller than the thickness of the second island 151.

In an exemplary embodiment, the first protection pattern 122 and the second protection pattern 152 have a thickness of 50 to 2000 Å.

It is to be noted that, in the case where the first spacer layer 12 further comprises the first protection pattern 122 and the second spacer layer 15 is present, the second spacer layer 15 may comprise the second protection pattern 152 or may not comprise the second protection pattern 152. In contrast, in the case where the second spacer layer 15 further comprises the second protection pattern 152, the first spacer layer 12 may comprise the first protection pattern 122 or may not comprise the first protection pattern 122.

The way to form the first spacer layer 12 generally includes firstly forming an inorganic thin film, and then etching the inorganic thin film to form the first spacer layer 12. The second spacer layer 15 is formed in substantially the same manner as the first spacer layer 12. However, when the inorganic thin film is being etched, if the inorganic thin film in a certain region is completely removed, the film layer under the inorganic thin film in this region may be damaged. Therefore, in the above embodiment, it is proposed to retain the first protective pattern 122 and the second protective pattern 152, thereby preventing the first flexible film layer 11 and the second flexible film layer 14 from being damaged.

In an exemplary embodiment, the thickness of the first flexible film layer 11 is larger than the thickness of the second flexible film layer 14. For example, the thickness of the second flexible film layer 14 may be 20% to 80% of the thickness of the first flexible film layer 11. In particular, the thickness of the second flexible film layer 14 is 40% to 60% of the thickness of the first flexible film layer 11. In this way, it can be ensured that the thickness of the second flexible film layer 14 falling into the first groove is smaller than the height of the first groove.

An embodiment of the present disclosure provides a display device comprising the flexible base substrate described in any of the foregoing embodiments. The display device may be a display panel or a display comprising a display panel. Moreover, the display device may be a liquid crystal display or an organic light emitting diode (OLED) display.

In a display device employing, for example, the flexible base substrate as shown in FIGS. 2(a), 2(b) and 2(c), since the gap between adjacent protrusions 112 can be regarded as a groove relative to the protrusions 112, when the flexible base substrate is being bent or elastically deformed in the direction perpendicular to the flexible base substrate, the groove between adjacent protrusions 112 can disperse the pressure applied to the surface of a side of the first flexible film layer 11 away from the first spacer layer 12, thereby reducing damage resulting from bending or elastic deformation of the flexible base substrate. On this basis, an organic material 13 is filled in the gap between adjacent first islands 121. Therefore, compared to the scheme of filling an inorganic material in the gap between adjacent first islands 121, when this flexible base substrate is being bent, stretched or elastically deformed, only the organic material 13 filled in the gap between adjacent first islands 121 is deformed, so that damage to the inorganic material can be avoided, and crack growth can also be prevented even if part of the inorganic material in the first island is damaged.

On this basis, in case the flexible base substrate is applied to a display device, since the capabilities of stretching, bending, elasticity and flexibility of the flexible substrate are enhanced, the flexible film layer may have an increased tolerance when a display pattern thereon is being deformed, thereby increasing the reliability and yield of the display device.

In a display device using, for example, the flexible base substrate as shown in FIGS. 3(a), 3(b) and 3(c), since the height of the organic material 13 is smaller than the height of the first groove, the first groove filled with the organic material 13 is still a groove. In this way, when the flexible base substrate is being bent or elastically deformed in the direction perpendicular to the flexible base substrate, a groove formed after the first groove is filled with the organic material 13 can disperse the pressure applied to the surface of a side of the first flexible film layer 11 close to the first spacer layer 12, thereby reducing damage resulting from bending or elastic deformation of the flexible base substrate. On this basis, an organic material 13 is filled in the first groove. Therefore, compared to the scheme of filling an inorganic material in the gap between adjacent first islands 121, when this flexible base substrate is being bent, stretched or elastically deformed, only the organic material 13 filled in the first groove is deformed, so that damage to the inorganic material can be avoided, and crack growth can also be prevented even if part of the inorganic material in the first island is damaged.

On this basis, in case the flexible base substrate is applied to a display device, since the capabilities of stretching, bending, elasticity and flexibility of the flexible substrate are enhanced, the flexible film layer may have an increased tolerance when a display pattern thereon is being deformed, thereby increasing the reliability and yield of the display device.

Figure 10:
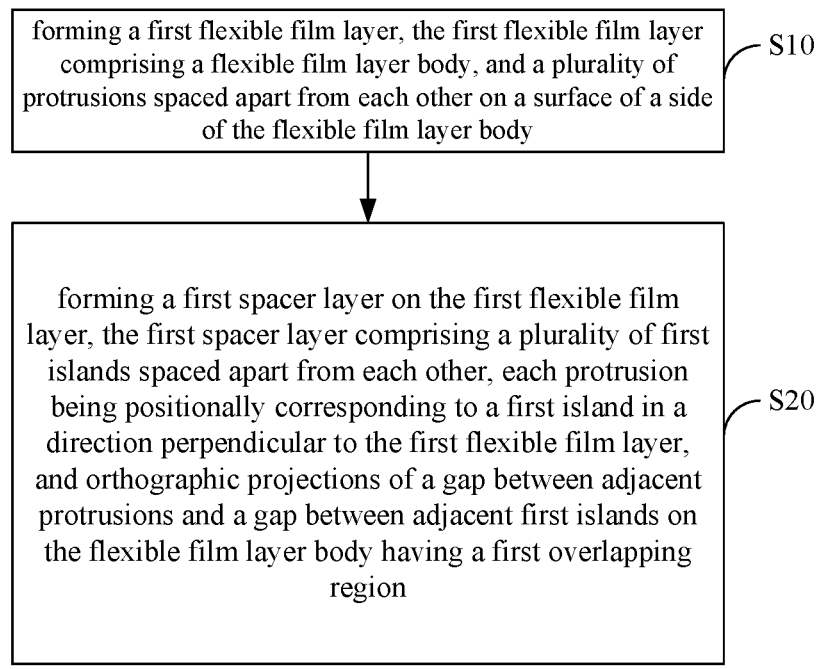
FIG. 10 is a flow chart of a method for manufacturing a flexible base substrate provided by an embodiment of the present disclosure.

In a further aspect, an embodiment of the present disclosure provides a method for manufacturing a flexible base substrate, as shown in FIG. 10.

Specifically, at step S10, a first flexible film layer 11 is formed. The first flexible film layer 11 comprises a flexible film layer body 111, and a plurality of protrusions 112 spaced apart from each other on a surface of a side of the flexible film layer body 111.

In this embodiment, a shape of a protrusion 112 is not limited, and a surface of a side thereof away from the flexible film layer body 111 may be a curved surface or a flat surface. When the surface of the side of the protrusion 112 away from the flexible film layer body 111 is a flat surface, the shape of the flat surface may be a circle, a rectangle, a diamond, a polygon, or the like.

At step S20, a first spacer layer 12 is formed on the first flexible film layer 11, and the first spacer layer 12 comprises a plurality of first islands 121 spaced apart from each other. Each protrusion 112 is positionally corresponding to a first island 121 in a direction perpendicular to the first flexible film layer 11, and orthographic projections of a gap between adjacent protrusions 112 and a gap between adjacent first islands 121 on the flexible film layer body 111 have a first overlapping region.

It is to be noted that the protrusions 112 may be disposed on a side of the flexible film layer body 111 close to the first spacer layer 12, as shown in FIGS. 2(a), 2(b) and 2(c), or as shown in FIGS. 3(a), 3(b) and 3(c), and the protrusions 112 may also be disposed on a side of the flexible film layer body 111 away from the first spacer layer 12.

In the case where the protrusions 112 are located between the first islands 121 and the flexible film layer body 111, a first groove between adjacent laminations including a protrusion 112 and a first island 121 is filled with an organic material 13, and a height of the organic material 13 is smaller than a height of the first groove in the direction perpendicular to the flexible film layer body 111. In the case where the first islands 121 are located on a side of the flexible film layer body 111 away from the plurality of protrusions 112, the gap between adjacent first islands 121 is filled with an organic material 13.

In the above embodiments, a height of a projection 112 is not limited as long as a gap can be formed between adjacent projections 112. For example, in the case where the first island 121 is located on a side of the flexible film layer body 111 away from the plurality of protrusions 112, the thickness of the protrusion 112 may be 20% to 200% of the thickness of the flexible film layer body 111, and in order to reduce the manufacturing cost, in particular, the thickness of the protrusion 112 may be 40% to 120% of the thickness of the flexible film layer body 111. In the case where the protrusion 112 is located between the first island 121 and the flexible film layer body 111, for example, the thickness of the protrusion 112 may be 20% to 80% of the thickness of the flexible film layer body 111, and in order to reduce the manufacturing cost, in particular, the thickness of the protrusion 112 may be 30% to 60% of the thickness of the flexible film layer body 111.

An inorganic material may be employed as the material of the first spacer layer 12, for example, the material of the first spacer layer 12 may be SiOx.

In the case where the protrusions 112 are located between the first islands 121 and the flexible film layer body 111, in consideration of the need for further disposing the first spacer layer 12 on a side of the protrusion 112 away from the flexible film layer body 111, the surface of the side of the protrusion 112 away from the flexible film layer body 111 may be made a flat surface.

In the above embodiments, the dimensional relationship between any protrusion 112 and a positionally corresponding first island 121 thereof is not limited in the direction parallel to the flexible film layer body 111, as long as each protrusion 112 is positionally corresponding to a first island 121, and orthographic projections of a gap between adjacent protrusions 112 and a gap between adjacent first islands 121 on the flexible film layer body 111 have a first overlapping region.

For example, as shown in FIGS. 2(a) and 3(a), the orthographic projections of the first island 121 and the protrusion 112 on the flexible film layer body 111 completely overlap each other. Alternatively, as shown in FIGS. 2(b) and 3(b), the area of the orthographic projection of the first island 121 on the flexible film layer body 111 is smaller than the area of the orthographic projection of the protrusion 112 on the flexible film layer body 111, and the orthographic projection of the protrusion 112 on the flexible film layer body 111 completely covers the orthographic projection of the first island 121 on the flexible film layer body 111. Alternatively, as shown in FIGS. 2(c) and 3(c), the orthographic projection of the first island 121 on the flexible film layer body 111 is larger than the orthographic projection of the protrusion 112 on the flexible film layer body 111, and the orthographic projection of the first island 121 on the flexible film layer body 111 completely covers the orthographic projection of the protrusion 112 on the flexible film layer body 111.

In an exemplary embodiment, the organic material 13 filled in the first groove or in the gap between adjacent first islands 121 may be the same as or different from the material of the first flexible film layer 11 as long as the organic material 13 filled in the first groove or in the gap between adjacent first islands 121 and the material of the first flexible film layer 11 have high flexibility. For example, the organic material 13 and the material of the first organic film layer 11 may be PI.

Upon implementation, an inorganic thin film may be first formed on the first flexible film layer 11, and then a first spacer layer 12 is formed by exposure, development, and etching processes. It is possible to completely etch the inorganic thin film located between the first islands 121, or retain the inorganic thin film having a thickness of 50~2000 Å.

The above manufacturing method of a flexible base substrate provided by the present disclosure has the same technical effects as the aforementioned flexible base substrate, and details are not described herein again.

It is to be noted that, if the flexible base substrate is only manufactured on a rigid substrate, the rigid substrate may be stripped off after the flexible base substrate is formed. If it is further required to form a display pattern on the flexible base substrate after the flexible base substrate has been manufactured on a rigid substrate, the rigid substrate 10 should be stripped off after the display pattern is formed.

Figure 11:
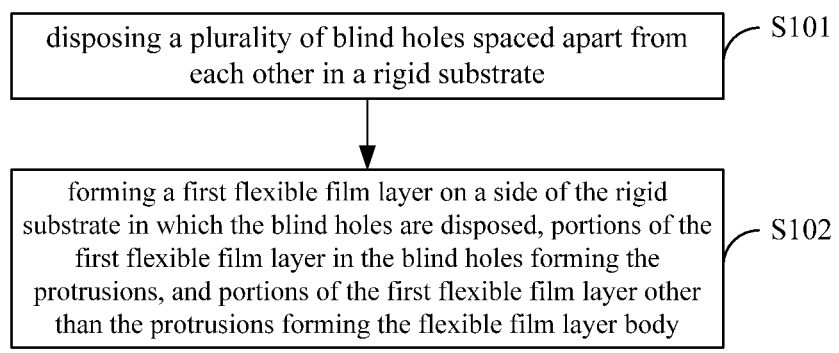
FIG. 11 is a flow chart of fabrication of a first flexible film layer provided by an embodiment of the present disclosure.

In an exemplary embodiment, as shown in FIG. 11, the first flexible film layer 11 may specifically formed by the following steps.

Figure 12A:
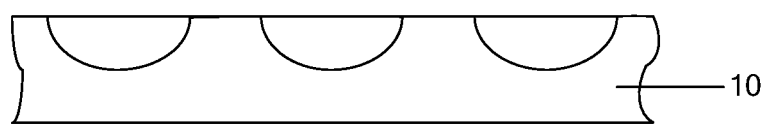
FIG. 12(a) is a schematic view illustrating a process of fabricating a first flexible film layer provided by an embodiment of the present disclosure.

At step S101, as shown in FIG. 12(a), a plurality of blind holes spaced apart from each other are disposed in the rigid substrate 10. The rigid substrate 10 may be, for example, a glass substrate.

A shape of the blind hole is not limited here because the blind hole can be used to form the protrusion 112 in the following step S102, and therefore, the shape of the blind hole corresponds to the shape of the protrusion 112.

Similarly, the height of the protrusion 112 is not limited as long as a gap can be formed between adjacent protrusions 112. For example, the depth of the blind hole in the rigid substrate 10 may be 20% to 200% of the thickness of the flexible film layer body 111. Moreover, in order to further enhance the bending ability of the resulting flexible base substrate, and reduce the manufacturing cost, in particular, the depth of the blind hole in the rigid substrate 10 may be 40% to 120% of the thickness of the flexible film layer body 111.

Figure 12B:
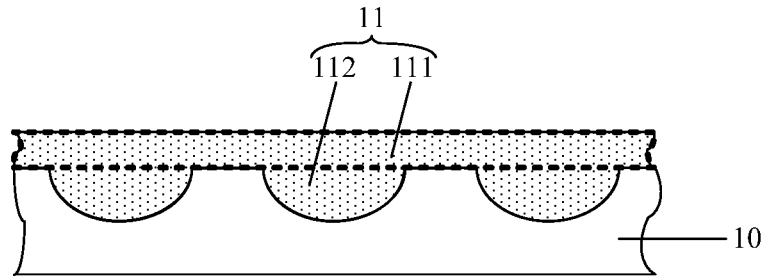
FIG. 12(b) is a schematic view illustrating a process of fabricating a first flexible film layer provided by an embodiment of the present disclosure.

At step S102, as shown in FIG. 12(b), a first flexible film layer 11 is formed on a side of the rigid substrate 10 provided with the blind holes, portions of the first flexible film layer 11 in the blind holes form the protrusions 112, and portions of the first flexible film layer 11 other than the protrusions 112 form the flexible film layer body 111.

Specifically, a flexible material may be first coated on the rigid substrate 10, and then the flexible material is baked to form the first flexible film layer 11.

In the embodiment of the present disclosure, since the flexible base substrate needs to be formed on the rigid substrate, in the case where the first islands 121 are located on a side of the flexible film layer body 111 away from the plurality of protrusions 112, a plurality of blind holes are disposed spaced apart from each other in the rigid substrate 10 to form the first flexible film layer 11 including the flexible film layer body 111 and the protrusions 112, which is simple and easy to operate and can also reduce the manufacturing cost.

Figure 13:
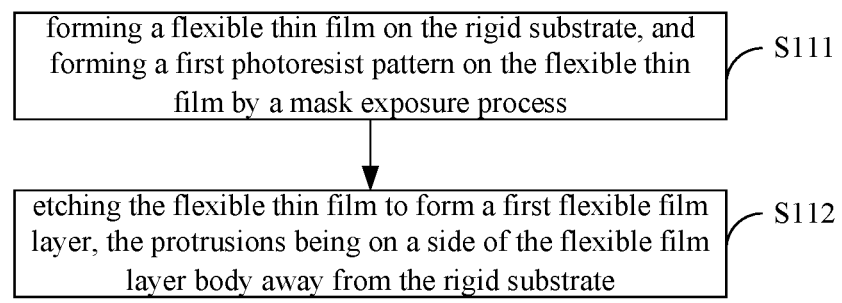
FIG. 13 is a flow chart of fabrication of a first flexible film layer provided by an embodiment of the present disclosure.

Alternatively, as shown in FIG. 13, the first flexible film layer 11 may be specifically formed by the following steps.

Figure 14A:
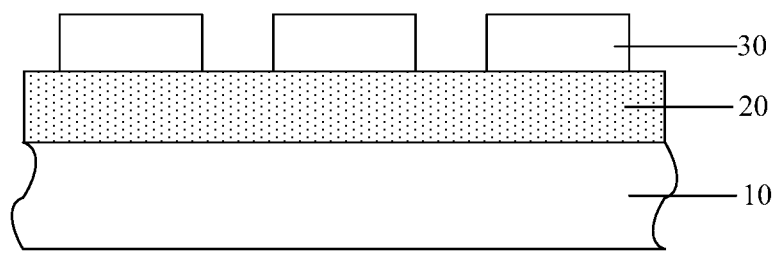
FIG. 14(a) is a schematic view illustrating a process of fabricating a first flexible film layer provided by an embodiment of the present disclosure.

At step S111, as shown in FIG. 14(a), a flexible thin film 20 is formed on the rigid substrate 10, and a first photoresist pattern 30 is formed on the flexible thin film 20 by a mask exposure process.

Figure 14B:
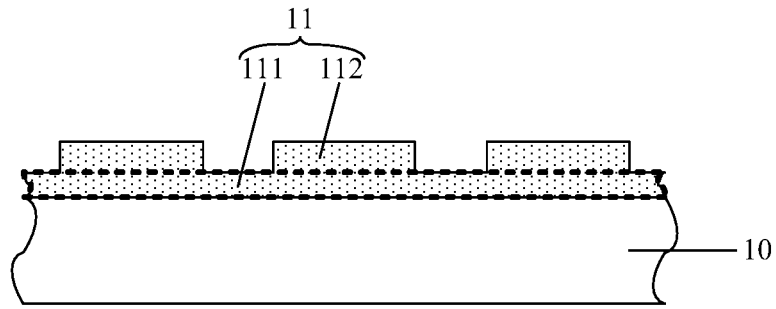
FIG. 14(b) is a schematic view illustrating a process of fabricating a first flexible film layer provided by an embodiment of the present disclosure.

At step S112, as shown in FIG. 14(b), the flexible thin film 20 is etched to form a first flexible film layer 11, wherein the protrusions 112 are located on a side of the flexible film layer body 111 away from the rigid substrate 10.

Here, the flexible film layer body 111 and the protrusions 112 on the flexible film layer body 111 can be formed by controlling the etching time of the flexible thin film 20.

The rigid substrate 10 may be, for example, a glass substrate. Upon implementation, a flexible material may be first coated on the rigid substrate 10, and then the flexible material is baked to form the flexible thin film 20.

It is to be noted that the thickness of the protrusion 112 is not limited as long as a gap can be formed between adjacent protrusions 112. For example, the thickness of the protrusion 112 may be 20% to 80% of the thickness of the flexible film layer body 111, and in order to reduce the manufacturing cost, in particular, the thickness of the protrusion 112 may be 30% to 60% of the thickness of the flexible film layer body 111.

In the embodiments of the present disclosure, in the case where the plurality of protrusions 112 are disposed between the first islands 121 and the first flexible film layer body 111, the first flexible film layer 11 including the flexible film layer body 111 and the protrusions 112 may be formed by a patterning process. The manufacturing method is simple and easy to operate.

Figure 15:
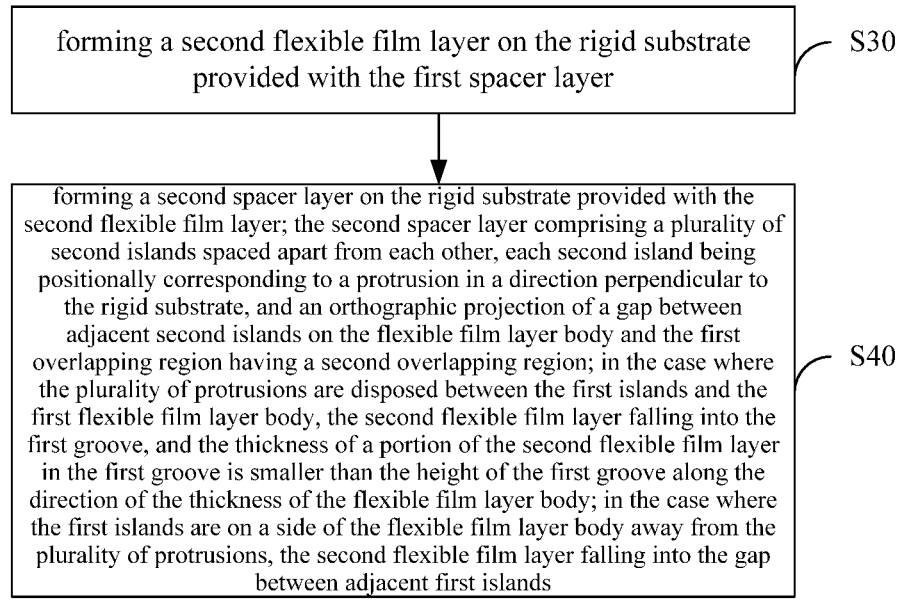
FIG. 15 is a flow chart of fabrication of a second flexible substrate provided by an embodiment of the present disclosure.

In an exemplary embodiment, the flexible base substrate described above may further comprise a second flexible substrate. As shown in FIG. 15, the second flexible substrate may be specifically formed by the following steps.

At step S30, a second flexible film layer 14 is formed on the rigid substrate 10 on which the first spacer layer 12 is formed.

Here, a flexible material may be first coated on the rigid substrate 10 on which the first spacer layer 12 is formed, and then the flexible material is baked to form the second flexible film layer 14.

At step S40, a second spacer layer 15 is formed on the rigid substrate 10 on which the second flexible film layer 14 is formed. The second spacer layer 15 comprises a plurality of second islands 151 spaced apart from each other. Each second island 151 is positionally corresponding to a protrusion 112 in a direction perpendicular to the rigid substrate 10, and an orthographic projection of a gap between adjacent second islands 151 on the flexible film layer body 111 and the first overlapping region have a second overlapping region. In the case where the plurality of protrusions 112 are disposed between the first islands 121 and the first flexible film layer body 111, the second flexible film layer 14 falls into the first groove, and the thickness of a portion of the second flexible film layer 14 in the first groove is smaller than the height of the first groove along the direction of the thickness of the flexible film layer body 111. In the case where the first islands 121 are located on a side of the flexible film layer body 111 away from the plurality of protrusions 112, the second flexible film layer 14 falls into the gap between adjacent first islands 121.

In the above embodiments, the dimensional relationship between any protrusion 112 and a positionally corresponding second island 151 thereof is not limited in the direction parallel to the flexible base substrate, as long as each protrusion 112 is positionally corresponding to a second island 151, and an orthographic projection of a gap between adjacent second islands 151 on the flexible film layer body 111 and the first overlapping region have a second overlapping region.

Specifically, in an exemplary embodiment, as shown in FIGS. 3 and 4, the orthographic projections of the first island 121 and the second island 151 on the flexible film layer body 111 completely overlap the orthographic projection of the protrusion 112 on the flexible film layer body 111. Alternatively, the orthographic projection of the first island 121 on the flexible film layer body 111 is smaller or larger than the orthographic projection of the protrusion 112 on the flexible film layer body 111, and the orthographic projection of the second island 151 on the flexible film layer body 111 may only overlap the orthographic projection of the protrusion 112 on the flexible film layer body 111, or may only overlap the orthographic projection of the first island 121 on the flexible film layer body 111. Of course, alternatively, the orthographic projection of the second island 151 on the flexible film layer body 111 may neither overlap the orthographic projection of the protrusion 112 on the flexible film layer body 111 nor overlap the orthographic projection the first island 121 on the flexible film layer body 111.

When the orthographic projections of the first island 121 and the second island 151 on the flexible film layer body 111 completely overlap the orthographic projection of the protrusion 112 on the flexible film layer body 111, on the one hand, a space of the first groove or between adjacent first islands 121 is large enough so that more of the second flexible film layer 14 falls into the first groove or the gap between adjacent first islands 121 to avoid damage to the inorganic material; on the other hand, the flexible base substrate can be bent, stretched, and elastically deformed only in the region where the first groove or the gap between adjacent first islands 121 (which also may be adjacent second islands 151) is located as much as possible.

On this basis, in case the flexible base substrate is applied to a display device, it is possible to make the orthographic projection of a highly flexible metal wire on the flexible film layer body 111 fall into the orthographic projection of the gap between adjacent protrusions 112 on the flexible film layer body 111, so that the orthographic projections of display patterns that are not easily deformed such as an active layer, a gate insulating layer, and the like on the flexible film layer body 111 fall into the orthographic projections of the plurality of protrusions 112 on the flexible film layer body 111. The material of the above-mentioned highly flexible metal wire may be, for example, titanium (Ti), aluminum (Al) or the like.

As used above, the second flexible film layer 14 falling into the first groove means that a portion of the second flexible film layer 14 in the first groove is filled in the first groove as the organic material 13. The second flexible film layer 14 falling into the gap between adjacent first islands 121 means that a portion of the second flexible film layer 14 between adjacent first islands 121 is filled in the gap between the first islands 121 as the organic material 13.

Therefore, the material of the second flexible film layer 14 may be the same as the material of the first organic film layer 11, for example, the material of the second flexible film layer 14 and the first organic film layer 11 is PI.

Since the height of the first groove is greater than the height of the gap between adjacent first islands 121 in the direction perpendicular to the flexible film layer body 111, when the second flexible film layer 14 has a large thickness, as shown in FIG. 4, the sum of the thickness of the first island 121 and the thickness of the portion of the second flexible film layer 14 located on the first island 121 is substantially equal to the thickness of the portion of the second flexible film layer 14 located between adjacent first islands 121; or as shown in FIG. 5, the sum of the thickness of the first island 121 and the thickness of the portion of the second flexible film layer 14 located on the first island 121 is larger than the thickness of the portion of the second flexible film layer 14 located between adjacent first islands 121.

Further, in order to bend or elastically deform the flexible base substrate along the direction perpendicular to the flexible base substrate, the thickness of the portion of the second flexible film layer 14 between adjacent first islands 121 may be reduced by exposure, development and etching processes during the process of forming the second flexible film layer 14, so that the thickness of the portion of the second flexible film layer 14 between adjacent first islands 121 is 20% to 80%, in particular, 40% to 60% of the thickness of other portions of the second flexible film layer 14.

Upon implementation, an inorganic thin film may be first formed on the second flexible film layer 14, and then the inorganic thin film is etched to form a second spacer layer 15. It is possible to completely remove the inorganic thin film located between the second islands 151, or retain the inorganic thin film having a thickness of 50~2000 Å.

In an embodiment of the present disclosure, the flexible base substrate may further comprise a second flexible substrate depending on a position of a neutral layer of the flexible base substrate, so as to improve the practicability of the flexible base substrate.

What have been described above are only specific embodiments of the present disclosure, but the scope of the present disclosure is not so limited. Any variations or substitutions that can be readily conceived by a skilled to person familiar with this technical field within the technical scope revealed by the present disclosure shall be encompassed within the scope of the present disclosure. Thus, the scope of the present disclosure should be determined by the scope of the claims.

The invention claimed is:

1. A flexible base substrate, comprising a first flexible substrate, the first flexible substrate comprising:
   a first flexible film layer, the first flexible film layer comprising a flexible film layer body, and a plurality of protrusions spaced apart from each other on a first surface of the flexible film layer body;
   a first spacer layer disposed on a second surface of the flexible film layer body, the first spacer layer comprising a plurality of first islands spaced apart from each other, the second surface of the flexible film layer body being directly opposite to the first surface of the flexible film layer body; and
   a first groove between adjacent first islands, the first groove being filled with a first organic material layer, and a height of the first organic material layer being smaller than a height of the first groove in a direction perpendicular to the first surface of the flexible film layer body,
   wherein each protrusion is positionally corresponding to a first island in the direction perpendicular to the first surface of the flexible film layer body, and orthographic projections of a gap between adjacent protrusions and a gap between adjacent first islands on the first surface of the flexible film layer body have a first overlapping region.

2. The flexible base substrate according to claim 1, wherein each protrusion has a thickness of 40% to 120% of a thickness of the flexible film layer body.

3. The flexible base substrate according to claim 1, wherein each protrusion has a thickness of 30% to 60% of a thickness of the flexible film layer body.

4. The flexible base substrate according to claim 1, wherein an orthographic projection of each protrusion on the first surface of the flexible film layer body completely overlaps an orthographic projection of a positionally corresponding first island on the first surface of the flexible film layer body.

5. The flexible base substrate according to claim 1, wherein a material of the first organic material layer is the same as a material of the first flexible film layer.

6. The flexible base substrate according to claim 1, further comprising a second flexible substrate, the second flexible substrate comprising:
   a second flexible film layer; and
   a second spacer layer which is disposed on a side of the second flexible film layer away from the first flexible film layer, and comprises a plurality of second islands spaced apart from each other, each second island being positionally corresponding to a protrusion in the direction perpendicular to the flexible film layer body, an orthographic projection of a gap between adjacent second islands on the first surface of flexible film layer body and the first overlapping region having a second overlapping region,
   wherein a portion of the second flexible film layer fills the first groove.

7. The flexible base substrate according to claim 6, further comprising a second organic material layer between adjacent second islands.

8. The flexible base substrate according to claim 6, wherein orthographic projections of a first island, a second island and a protrusion positionally corresponding to each other on the first surface of the flexible film layer body completely overlap each other.

9. The flexible base substrate according to claim 6, wherein the second spacer layer further comprises a second protection pattern between adjacent second islands, and the second protection pattern has a thickness smaller than that of a second island.

10. The flexible base substrate according to claim 6, wherein the first flexible film layer has a thickness larger than that of the second flexible film layer.

11. The flexible base substrate according to claim 1, further comprising a second flexible substrate, the second flexible substrate comprising:
   a second flexible film layer; and
   a second spacer layer which is disposed on a side of the second flexible film layer away from the first flexible film layer, and comprises a plurality of second islands spaced apart from each other, each second island being positionally corresponding to a protrusion in the direction perpendicular to the flexible film layer body, and an orthographic projection of a gap between adjacent second islands on the first surface of the flexible film layer body and the first overlapping region having a second overlapping region,
   wherein a portion of the second flexible film layer fills the first groove, and the portion of the second flexible film layer serves as the first organic material layer.

12. The flexible base substrate according to claim 11, further comprising a second organic material layer or between adjacent second islands, wherein a height of a surface of the second organic material layer away from the flexible film layer body is smaller than a height of a surface of the second island away from the flexible film layer body.

13. The flexible base substrate according to claim 1, wherein the first spacer layer further comprises a first protection pattern between adjacent first islands, and
the first protection pattern has a thickness smaller than that of a first island.

14. A display device, comprising the flexible base substrate according to claim 1.

15. A method for manufacturing the flexible base substrate according to claim 1, comprising:
providing the first flexible film layer, the first flexible film layer comprising the flexible film layer body, and the plurality of protrusions spaced apart from each other on the first surface of the flexible film layer body;
forming the first spacer layer on the second surface of the first flexible film layer directly opposite to the first surface of the flexible film layer body, the first spacer layer comprising the plurality of first islands spaced apart from each other; and
forming the first groove between adjacent first islands, the first groove being filled with the first organic material layer, and the height of the first organic material layer being smaller than the height of the first groove in the direction perpendicular to the first surface of the flexible film layer body.

16. The method according to claim 15, further comprising:
providing a second flexible film layer; and
providing a second spacer layer on a side of the second flexible film layer away from the first flexible film layer, the second spacer layer comprising a plurality of second islands spaced apart from each other, each second island being positionally corresponding to a protrusion in the direction perpendicular to the flexible film layer body, and an orthographic projection of a gap between adjacent second islands on the flexible film layer body and the first overlapping region having a second overlapping region, wherein a portion of the second flexible film layer fills the first groove.

17. A method for manufacturing a flexible base substrate, comprising:
providing a first flexible film layer, the first flexible film layer comprising a flexible film layer body, and a plurality of protrusions spaced apart from each other on a surface of a side of the flexible film layer body;
forming a first spacer layer on the first flexible film layer, the first spacer layer comprising a plurality of first islands spaced apart from each other, and
forming a first groove between adjacent first islands, the first groove being filled with a first organic material layer, and a height of the first organic material layer being smaller than a height of the first groove in a direction perpendicular to the flexible film layer body,
wherein each protrusion is positionally corresponding to a first island in the direction perpendicular to the flexible film layer body, and orthographic projections of a gap between adjacent protrusions and a gap between adjacent first islands on the flexible film layer body have a first overlapping region,
wherein said providing a first flexible film layer comprises:
disposing a plurality of blind holes spaced apart from each other in a rigid substrate;
forming a first flexible film layer on a side of the rigid substrate provided with the blind holes, portions of the first flexible film layer in the blind holes forming the protrusions, portions of the first flexible film layer other than the portions forming the protrusions forming the flexible film layer body.

18. A method for manufacturing a flexible base substrate, comprising:
providing a first flexible film layer, the first flexible film layer comprising a flexible film layer body, and a plurality of protrusions spaced apart from each other on a surface of a side of the flexible film layer body;
forming a first spacer layer on the first flexible film layer, the first spacer layer comprising a plurality of first islands spaced apart from each other; and
forming a first groove between adjacent first islands, the first groove being filled with a first organic material layer, and a height of the first organic material layer being smaller than a height of the first groove in a direction perpendicular to the flexible film layer body,
wherein each protrusion is positionally corresponding to a first island in the direction perpendicular to the flexible film layer body, and orthographic projections of a gap between adjacent protrusions and a gap between adjacent first islands on the flexible film layer body have a first overlapping region,
wherein said providing a first flexible film layer comprises:
forming a flexible film on a rigid substrate;
forming a first photoresist pattern on the flexible film using a mask exposure process; and
etching the flexible film using the first photoresist pattern as a mask to form the first flexible film layer, the protrusions being disposed on a side of the flexible film layer body away from the rigid substrate.

* * * * *